United States Patent [19]
Cohen

[11] Patent Number: 5,468,680
[45] Date of Patent: Nov. 21, 1995

[54] METHOD OF MAKING A THREE-TERMINAL FUSE

[75] Inventor: Simon S. Cohen, Burlington, Mass.

[73] Assignee: Massachusetts Institute of Technology, Cambridge, Mass.

[21] Appl. No.: 210,344

[22] Filed: Mar. 18, 1994

[51] Int. Cl.$^6$ .......................... H01L 21/14; H01L 21/44
[52] U.S. Cl. .................. 437/170; 437/195; 437/922; 148/DIG. 55; 257/229; 257/230; 365/96
[58] Field of Search .................... 148/D55; 437/922, 437/170, 195 US, 195 F; 257/229, 230, 665; 365/96

[56] References Cited

U.S. PATENT DOCUMENTS

| | | | |
|---|---|---|---|
| 3,245,051 | 4/1966 | Robb | 340/173 |
| 3,582,908 | 6/1971 | Koo | 340/173 |
| 3,634,929 | 1/1972 | Yoshida et al. | 148/DIG. 55 |
| 3,717,852 | 2/1973 | Abbas et al. | 148/DIG. 55 |
| 3,733,690 | 5/1973 | Rizzi et al. | 437/170 |
| 3,863,231 | 1/1975 | Taylor | 340/173 |
| 4,042,950 | 8/1977 | Price | 357/51 |
| 4,210,875 | 7/1980 | Beasom . | |
| 4,562,639 | 1/1986 | McElroy | 437/170 |
| 4,605,872 | 8/1986 | Rung | 307/465 |
| 4,630,355 | 12/1986 | Johnson | 437/170 |
| 4,876,220 | 10/1989 | Mohsen et al. | 437/170 |
| 5,163,180 | 11/1992 | Eltouchy et al. . | |
| 5,200,652 | 4/1993 | Lee | 365/96 |
| 5,258,643 | 11/1993 | Cohen | 257/530 |
| 5,276,653 | 1/1994 | McKenny | 365/225.7 |
| 5,281,541 | 1/1994 | Saito et al. | 437/170 |
| 5,299,151 | 3/1994 | Ishihara et al. | 257/529 |
| 5,304,508 | 4/1994 | Cohen | 437/922 |

OTHER PUBLICATIONS

Cohen, S. S., Raffel, J. I. and Wyatt, P. W., IEEE Electron Dev. Lett., vol. 13, #9, (Sep. 1992), p. 488.
Yasaitis, J. A., Electronics Lett., Jun. 20, 1978 vol. 14, #15, pp. 460–462.
Carlson, A. B. and Gisser, D. G., "Electr. Eng. Concepts and Appl.", Addison–Wesley, Reading, 1990, 52–3.
Liu, D. K. Y., et al., IEEE. Electr. Dev. Lett. vol. 12, #4, (1991) 151–153.
Cohen, S. S., et al., "A Novel Metal–Insulator–Metal Structure for Field–Programmable Devices," *IEEE Transactions on Electron Devices*, 40(7):1277–1283, (Jul. 1993).
Mahan, J. E., "Threshold and memory switching in polycrystalline silicon," *Appl. Phys. Lett.*, 41(5):479–481, (Sep. 1982).
Klein, N., "The mechanism of self–healing electrical breakdown in MOS structures," *IEEE Trans. Electron Devices*, vol. ED–13, p. 788, (1966).

*Primary Examiner*—Brian E. Hearn
*Assistant Examiner*—Leon Radomsky
*Attorney, Agent, or Firm*—Hamilton, Brook, Smith & Reynolds

[57] ABSTRACT

A device and a method for interrupting the continuity of a conductor and linking a pair of conductors are disclosed. The device is a three-terminal fuse having first and second terminals initially connected by a conductor and a third terminal separated from the conductor at a breakpoint of the conductor by an insulator. By applying a voltage across the third terminal or control terminal and the conductor, a transient conductive link is formed between the conductor and the control terminal. If sufficient current is provided through the transient link, heating of the link causes the metal of the conductor to melt and boil away, thus interrupting the continuity of the conductor.

6 Claims, 10 Drawing Sheets

METHOD OF MAKING A THREE-TERMINAL FUSE

BACKGROUND OF THE INVENTION

In integrated circuit technology, it is often required to make or break electrical connections in order to fabricate and/or modify a circuit. For example, in programming logic arrays, certain gates and circuit elements must be connected while others must be isolated. Also, individual memory cells of programmable read only memories can be programmed by selectively connecting and isolating individual cells from certain conducting lines.

Various devices and methods have been developed to cut or fuse a conductor to permanently interrupt its continuity, many of which are applicable for use in integrated circuits. These prior fuses typically include a resistance within the conductive path. By passing a large enough current through the resistive fuse, the fuse is heated to a sufficient level to melt the conductive metal and boil it away. Thus, the continuity of the line is permanently interrupted.

These prior fuse devices have several drawbacks. First, they introduce their own resistance into the conductive path which, depending upon the application, can have an undesirable effect. For example, if the line is to remain intact and continue to be used as a conductor, voltage drop, power dissipation and other resistive effects of the fuse are introduced into the circuit.

Also, access to the fuse to pass a fusing current through it can be difficult. In many of these prior devices, a pair of pointed probes contact opposite sides of the fuse to apply the fusing current. These systems require that the fuse be physically accessible. In addition, the process of precisely locating the probes to blow the fuse can be slow and inefficient.

Other prior fuse devices involve cutting the conductor with a laser. In these devices a laser beam of sufficient power to melt the conductor is directed onto the conductor. This requires that the breakpoint of the conductor be physically accessible to oftentimes bulky laser equipment. Also, once again, precisely locating the laser beam on the conductor can be a slow process.

SUMMARY OF THE INVENTION

The present invention is directed to a three-terminal fuse (TTF) device and a method for interrupting the continuity of a conductor which overcomes the drawbacks of previous devices and methods. A control electrode is located adjacent to the conductor at an eventual breakpoint of the conductor. An insulator separates the conductor from the control electrode. To fuse the conductor, a programming voltage is applied across the control electrode and the conductor. The voltage is sufficiently high to cause the insulator to break down, and a resulting transient conductive link or filament is formed between the control electrode and the conductor. While the link is present, current continues to flow through the link and the region around the breakpoint of the conductor is heated. The amount of heat generated is controlled such that the metal of the conductor melts and boils away, thus permanently interrupting the continuity of the conductor.

The transient link current is carefully controlled to provide the proper amount of heating to the region of the breakpoint. If the current through the transient link is too low, insufficient heating will result, and the conductor will not be broken. If too much current passes through the transient link, excessive heating can result in damage to the control electrode, other conducting layers, other nearby devices, etc. Control of the link current is accomplished in one embodiment with a limiting resistance placed in series with the programming voltage source and the fuse structure.

By selection of an appropriate limiting resistance value and/or programming voltage, the fuse structure of the invention can be used to either fuse the conductor or to link the conductor to the control electrode. To form a link between the conductor and control electrode, the programming voltage is applied across the conducting layers at a voltage level high enough to cause the insulator to break down to form the conductive filament between the layers. The current flowing through the link heats the region which causes the metal in the conducting layers to melt and flow such that the two metal (conducting) layers are permanently connected across the insulator by conducting metal. Alternatively, the heating process alters the electrical properties of the insulating material in the region near the filament such that it becomes permanently conductive. Thus the structure of the invention can behave like prior antifuse devices if the structure and programming method of the device are properly chosen.

If a high enough programming voltage combined with a low enough limiting resistance is used, after the insulator begins to break down, sufficient current will flow through the transient link to heat the region and boil away the conductor and destroy the transient link, thus fusing the conductor. Thus, a single device may be used to both link and cut conductors depending on the level of current applied as the link is formed.

The resistive characteristic of the transient link or filament allows sufficient power to be delivered to the region in order to fuse the conductor. If the link were a pure conductor, it would be very difficult to deliver the power, since extremely high and possibly damaging currents would be required. Thus, it is the dynamic resistive properties of the transient conductive link of the invention which allow the required power to be delivered to the breakpoint. Once the resistance of the transient link drops to a very low value, the conductor can no longer be fused. The required fusing current must be delivered during the transient period.

As described above, in the present invention, it is current passing through the transient link which heats the conductor. In contrast, in the prior fusing devices, power dissipated in the series resistance of the fuse itself heated the conductor. The device of the invention provides the fusing capability without the introduction of any series resistance in the conductive path.

The device of the invention can be formed on any smooth substrate including semiconductor, glass, ceramic, etc. The conductor and control electrode can be made of any of a number of known conducting materials or combinations thereof, including aluminum, titanium, gold, platinum, molybdenum, polysilicon, etc. The insulator can be single or multi-layered and can include amorphous silicon, silicon oxide, silicon nitride, a silicon nitride-silicon oxide-silicon nitride composite, etc. Many other insulator configurations are possible; for example, all configurations described in patents assigned to Actel Corporation can be used in the device of the present invention.

The device of the invention is essentially a three-terminal fuse. Before the fusing operation, first and second terminals are connected to each other across a conductor having negligible series fuse resistance. The third terminal or control terminal is coupled to the conductor across an insulator with only minimal effect on the properties of the conductor. By applying a voltage between the third terminal and one of the first and second terminals, continuity between the first and second terminals is permanently interrupted. Thus, the device is an ideal once-programmable three-terminal switch whose resistance is sub-ohm before programming, infinite after programing and controlled by a second conductor that is completely isolated from the fuse body. It is equivalent to a once-programmable, ideal, normally closed relay and can be used in any application requiring these properties.

The potential applications and uses for the three-terminal fuse of the invention are tremendously varied and widespread. Virtually anywhere a traditional two-terminal fuse, laser cutting or a three-terminal switch is used, or where prior antifuses are used, the three-terminal fuse of the invention can be used instead to improve performance. Among the applications for the device are field programmable gate arrays and multichip modules, field programmable precision resistors and capacitors, memory repair, trimmable capacitors for RF circuits, detachable test points on integrated circuits, programmable delay lines, transmission line termination trim, flat panel display repair, neural network programmable synapses, etc.

BRIEF DESCRIPTION OF THE DRAWING

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
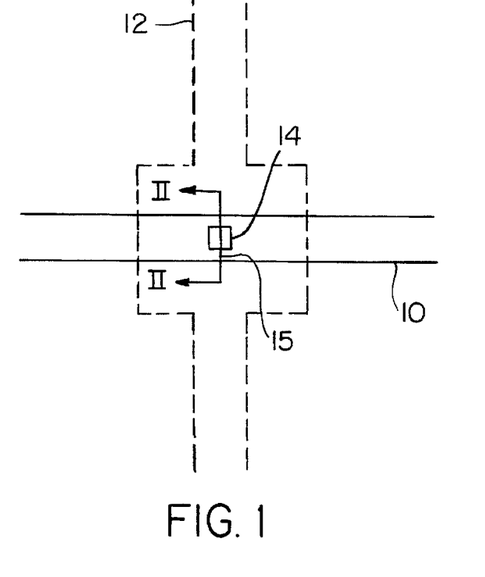
FIG. 1 is a schematic top view of a conductor and a control electrode in accordance with the present invention.

FIG. 1 is a schematic top elevational view of a small region of an integrated circuit showing a first or upper conductor 10 on the top surface of the circuit. Shown in phantom is a second or lower conductor or control electrode 12 beneath the first conductor 10. The fusing structure 14 of the present invention is located at an eventual breakpoint 15 of the conductor 10.

It should be noted that the terms upper and lower conductor or layer are used to distinguish between the conductors which are either linked or fused. In this description, the convention is that the upper layer will potentially be cut and the lower layer is used as the control electrode. However, this is not necessarily always true. The present invention contemplates that either layer can be cut and/or used as a control electrode.

Figure 2:
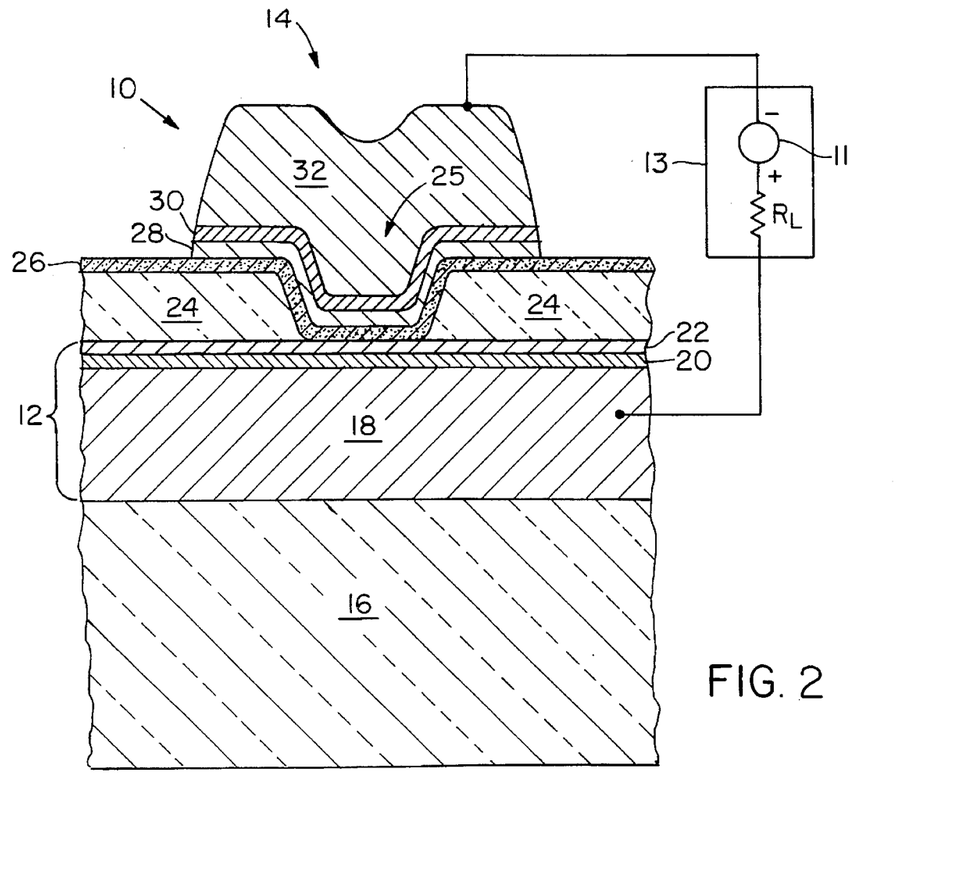
FIG. 2 is an enlarged cross-sectional view of the fuse structure of the invention taken along line II—II of FIG. 1.

FIG. 2 is an enlarged schematic cross-sectional view of the fusing structure 14 of the invention taken along cut line II—II of FIG. 1. The particular structure shown and described has been chosen because of its successful use as an antifuse device as presented in U.S. application Ser. No. 08/088,253, but any structures which present a transient link between conductors may be used. In FIG. 2, a programming circuit 13 comprising a voltage source 11 and a current limiting resistance $R_L$ is connected across the control electrode 12 and the conductor 10.

As shown in FIG. 2, the control electrode 12 is formed over a smooth substrate 16. The substrate can be a semiconductor material with an insulating overlayer including silicon dioxide, such as where the fusing device is used in conjunction with integrated circuits, or it can be any smooth substrate such as glass, ceramic, etc. In the preferred embodiment shown in FIG. 2, the control electrode 12 comprises three layers of metal. The first layer 18 is a layer of a non-refractory conductive material such as aluminum (1% silicon); the second layer 20 is a capping layer of about 10–50 nm of refractory conductive material such as titanium; and the third layer 22 is a 10–50 nm layer of aluminum (1% silicon).

An interlevel dielectric layer 24 is formed over the control electrode 12 to isolate it from the upper conductor 10. A via hole 25 is formed in the interlevel dielectric layer 24. The bottom of the via hole 25 extends to the top surface of the control electrode 12. The location of the via hole 25 defines the location of the potential breakpoint 15 (FIG. 1) of the upper conductor 10. A link insulator layer 26 is formed over of the interlevel dielectric 24. The link insulator 26 passes through the via hole 25 and contacts the top surface of the lower conductor 12. Alternatively, the link insulator may be flat on the lower conductor with the dielectric 24 over the link insulator. In that case, a suitable etch stop would be required over the link insulator. The link insulator can be a single layer of insulating material or it can be multiple layers. The insulating material can, for example, be amorphous silicon, oxide of silicon, a silicon nitride-silicon oxide-silicon nitride (NON) composite or other known insulator material. Typically, where an oxide of silicon is the insulator, it is approximately 100 Å thick. Where a NON insulator is used, each of the component layers is approximately 100 Å thick.

In the preferred embodiment, the upper conductor 10 is formed over the link insulator 26 and is a mirror image of the control electrode 12. Layer 28 is aluminum, layer 30 is titanium, and layer 32 is aluminum. Thus, within the via hole 25, the top conductor 10 is separated from the lower conductor 12 by only the link insulator layer 26.

It should be noted that either the control electrode 12 or the upper conductor 10 can have a number of configurations other than the three-layer configurations shown in the FIG. 2. For example, the conductors can be a single or double layer of other known conductive materials including aluminum, titanium, titanium-tungsten, gold, platinum, molybdenum, tungsten, polysilicon, etc.

To either link the upper conductor 10 with the control electrode 12 or to break or cut the conductor 10 by fusing it, a programming voltage $V_P$ in the form of a voltage pulse is applied across the control electrode 12 and upper conductor 10 by the voltage source 11 through the current limiting resistance $R_L$. When the programming pulse $V_P$ is applied, the link insulator 26 breaks down and the transient conductive link or filament between the control electrode 12 and the conductor 10 is formed. Depending upon the programming voltage $V_P$ and the limiting resistance $R_L$, either a permanent link will be formed or conductor 10 will be cut.

If either a relatively high limiting resistance $R_L$ or a relatively low programming voltage $V_P$ or a combination of both are used, a permanent link will be formed since, during the process, the current through the transient conductive link is not sufficient to deliver enough power to the region to melt and boil away the upper conductor 10 and to destroy the transient link. Under these conditions, the transient link is transformed into a permanent conductive path and, therefore, the two conducting layers 10 and 12 are linked.

If the resistance $R_L$ is reduced and/or the programming voltage $V_P$ is increased, the conductor 10 can be fused. As with the linking process, the insulating layer 26 breaks down under the application of the programming voltage $V_P$. Once again, the transient conductive link is formed. However, in this case, the current through the link is higher than in the linking process. The increased current results in more power being dissipated at the filament during its transient resistive phase. Heating occurs and the conductive layer 10 melts and boils. If the volume of metal in the top conductor 10 in the region of the via hole 25 is small enough, it boils away such that the continuity of the conductor 10 is completely interrupted.

Figure 3:
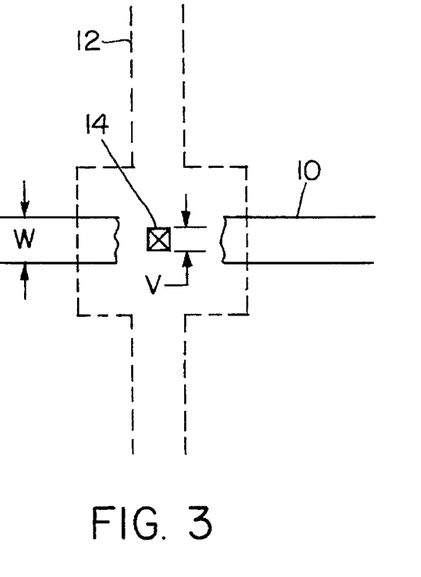
FIG. 3 is a schematic top elevational view of a conductor whose continuity has been interrupted by the fuse of the present invention.

FIG. 3 is a schematic top view of the conductor 10, control electrode 12 and the fuse structure 14 after the conductor 10 has been fused. Sufficient material has boiled away such that continuity of the conductor 10 has been destroyed.

From FIG. 3 it can be noted that the width W of the conductor 10 can affect the ability of the fuse device 14 to fuse the conductor 10. Where the via is sufficiently small and the width V of the via hole 25 approaches the width W of the conductor, the fuse device 14 will reliably fuse the conductor 10. However, if the width W of the conductor is much greater than the width V of the via hole, it becomes more difficult for the fuse structure to generate sufficient heat to melt enough metal to totally interrupt continuity. Under these circumstances, the reliability of the device is reduced. A typical via width V is 4 µm or less, specifically, between 0.2 and 2.0 µm. The conductor widths W must be compatible with the via widths V in order to allow the fuse to cut the conductor. Typically, for best results, the conductor should be no more than three times as wide as the via.

In order to fuse wide conductors, multiple fuse structures 14 can be formed beneath the same conductor. By applying the appropriate programming voltage to all of the fuses, continuity of the entire wide conductor can be completely interrupted.

Many variables affect the choice of limiting resistance $R_L$ and programming voltage $V_P$ required to either link or fuse the conductors. As previously mentioned, the width of the via hole 25 and the width of the conductor 10 will affect the fuse's ability to fuse the conductor 10. The thickness of the conductor 10 also has an effect. If the metal is made thin in the area of the via hole 25, less power will be required to boil it away. Therefore, the limiting resistance $R_L$ can be made larger or the programming voltage $V_P$ can be made smaller than would otherwise be required.

As described above, whether a link is formed or a conductor is fused can be controlled by controlling the amount of current which flows between conductors when the transient link or filament is established. Typically, for a NON-based link with each constituent layer being approximately 10 nm thick when a permanent link is being formed, the current is in a range of between about 5 and 10 milliamps, the programming voltage $V_P$ is between about 10 and 15 volts and the limiting resistance $R_L$ is generally above 1 kilohm. To fuse the conductor 10, the current through the transient link is typically about 100 to 300 milliamps, the programming voltage $V_P$ is between about 10 and 20 volts, and the limiting resistance $R_L$ is typically below 1 kilohm. Specifically, a typical value for resistance $R_L$ when cutting a conductor which is approximately 1 µm thick is approximately 100 ohms.

Ultimately, the amount of power dissipated in the transient link or filament determines whether sufficient heat will be generated to boil the conductor metal away. The maximum power will be transferred from the source 11 to the filament when the source impedance is most closely matched to the filament impedance. Therefore, it is the resistive property of the transient filament which allows the maximum power to be transferred to heat the area around the fuse structure. Since power dissipated in a resistance is given by $P=I^2R$, if the resistance of the filament is too low, sufficient power cannot be delivered to the region at safe current levels. By the same token, if the resistance is too high, sufficient current cannot flow, and once again very little power is delivered to the region.

Therefore, it is only while the filament is in the intermediate transient conductive condition with relatively high resistance, that maximum power is delivered, resulting in maximum heating effect. During this transient period, it is physically determined whether a link or a cut will be formed. If the current is high enough, then a cut will form. But, if the current is too low at that time, a link will form. Thus, it can be seen that after the transient filament portion of the process has terminated, if a permanent link has been formed, a cut cannot subsequently be formed at that position if the final link resistance is several ohms or less. This is because the permanent link has such low resistance that, at current levels which are safe and compatible with integrated circuit technology, sufficient power cannot be delivered to the region to melt the metal.

Figure 4A:
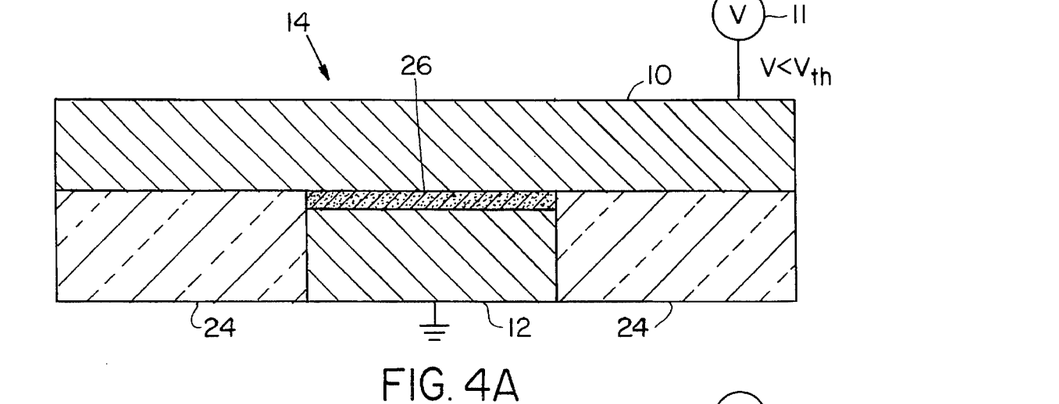
FIG. 4A is a schematic cross-sectional view of a device in accordance with the present invention before being programmed.
Figure 4B:
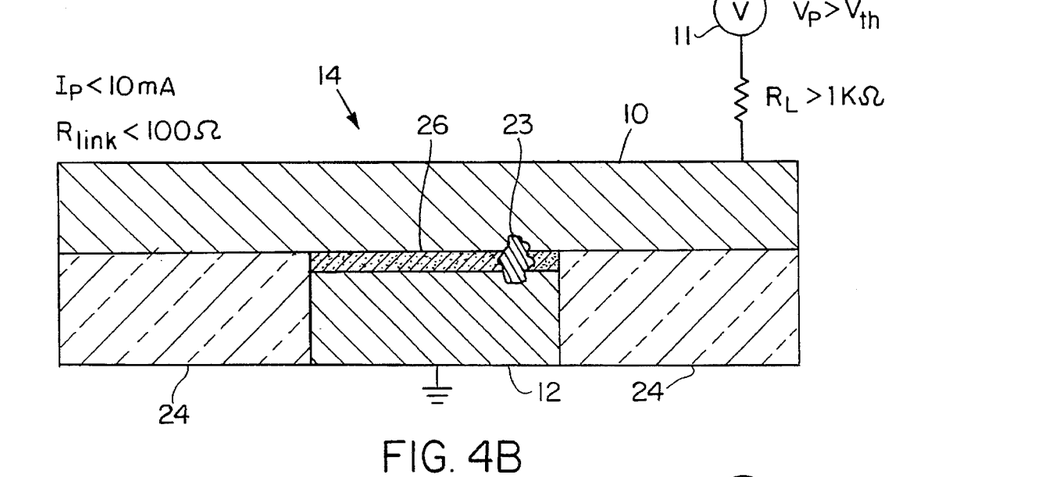
FIG. 4B is a schematic cross-sectional view of a device in accordance with the present invention after being programmed as a link.
Figure 4C:
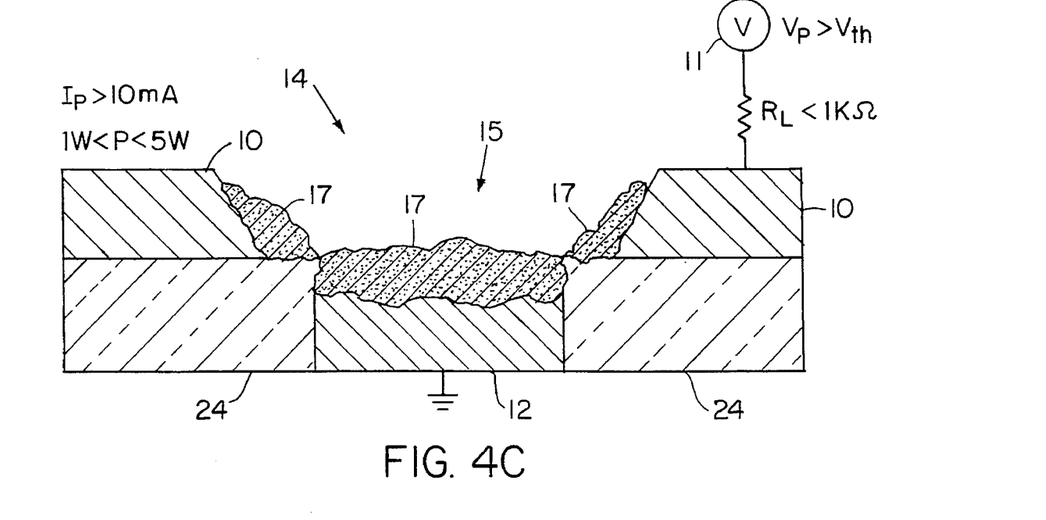
FIG. 4C is a schematic cross-sectional view of a device in accordance with the present invention after being programmed as a fuse.

FIGS. 4A–4C are schematic cross-sectional views of the fuse device 14 of the invention. The views of FIGS. 4A–4C are along a direction which is rotated 90° to the view of FIG. 2. That is, rather than looking down the length of the top conductor 10, the views of FIGS. 4A–4C look along the long side the conductor 10. FIG. 4A shows the condition of the device 14 before programming. The voltage source 11 is applied across conductor 10 and control electrode 12. The voltage is set well below the threshold voltage $V_{th}$ of the device such that the link insulator 26 is unaffected by the voltage. For example, this would be the situation during the normal operation of an integrated circuit which functions using either a 5.5 V or a 3 V power source.

FIG. 4B shows the structure of FIG. 4A after a programming voltage $V_P > V_{th}$ is applied across a limiting resistance $R_L > 1$ kilohm. Under these conditions, after the transient filament is created, a programming current $I_p$ of approximately 10 milliamps flows through the link insulator. Sufficient heat is generated such that the metal of the conductor 10 and the metal of the control electrode 12 flow together across the insulator, leaving a permanent conductive filament 23 connecting the two conductors across the link insulator. The resulting conductive filament 23 typically has a resistance $R_{link}$ less than one ohm up to about 200 ohms.

FIG. 4C shows the structure immediately after the conductor 10 has been cut or fused. A programming voltage $V_P > V_{th}$ was applied across the conductor 10 and control electrode 12 through a limiting resistance $R_L < 1$ kilohm. A programming current $I_P > 10$ milliamps flows through the transient filament, resulting in heat sufficient to destroy conductor 10 at the break point 15. Specifically, a power P between 1 watt and 5 watts is dissipated in the region of the transient link to destroy the conductor 10 in the region. In addition to breaking the conductor 10, the process leaves solidified insulating magma 17 deposited into the region along the surfaces of the control electrode 12 and the cut conductor 10.

Figure 5A:
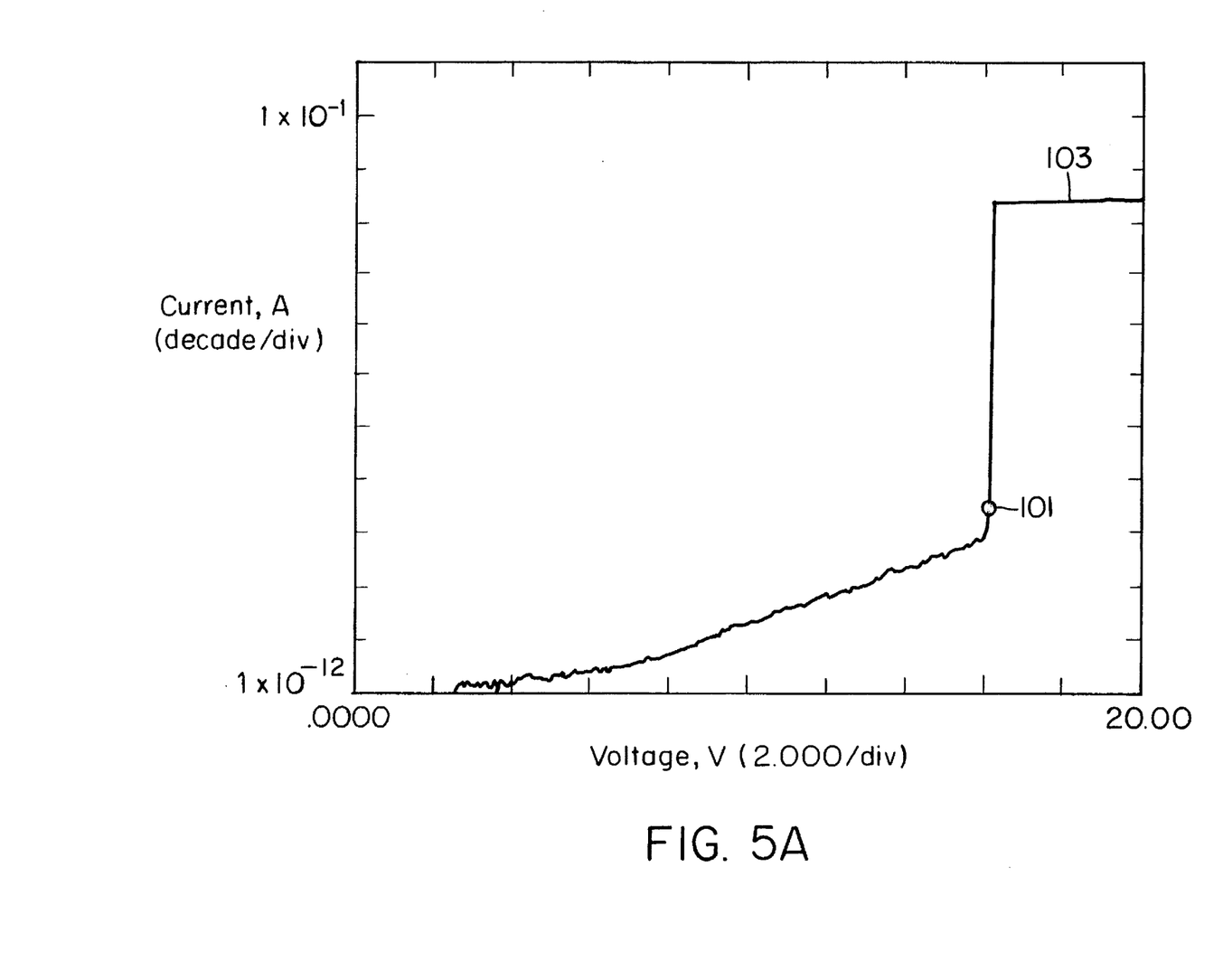
FIG. 5A is a plot of voltage applied across the conductors of the device of the invention versus the resulting current through the device for the conductor linking process of the invention.
Figure 5B:
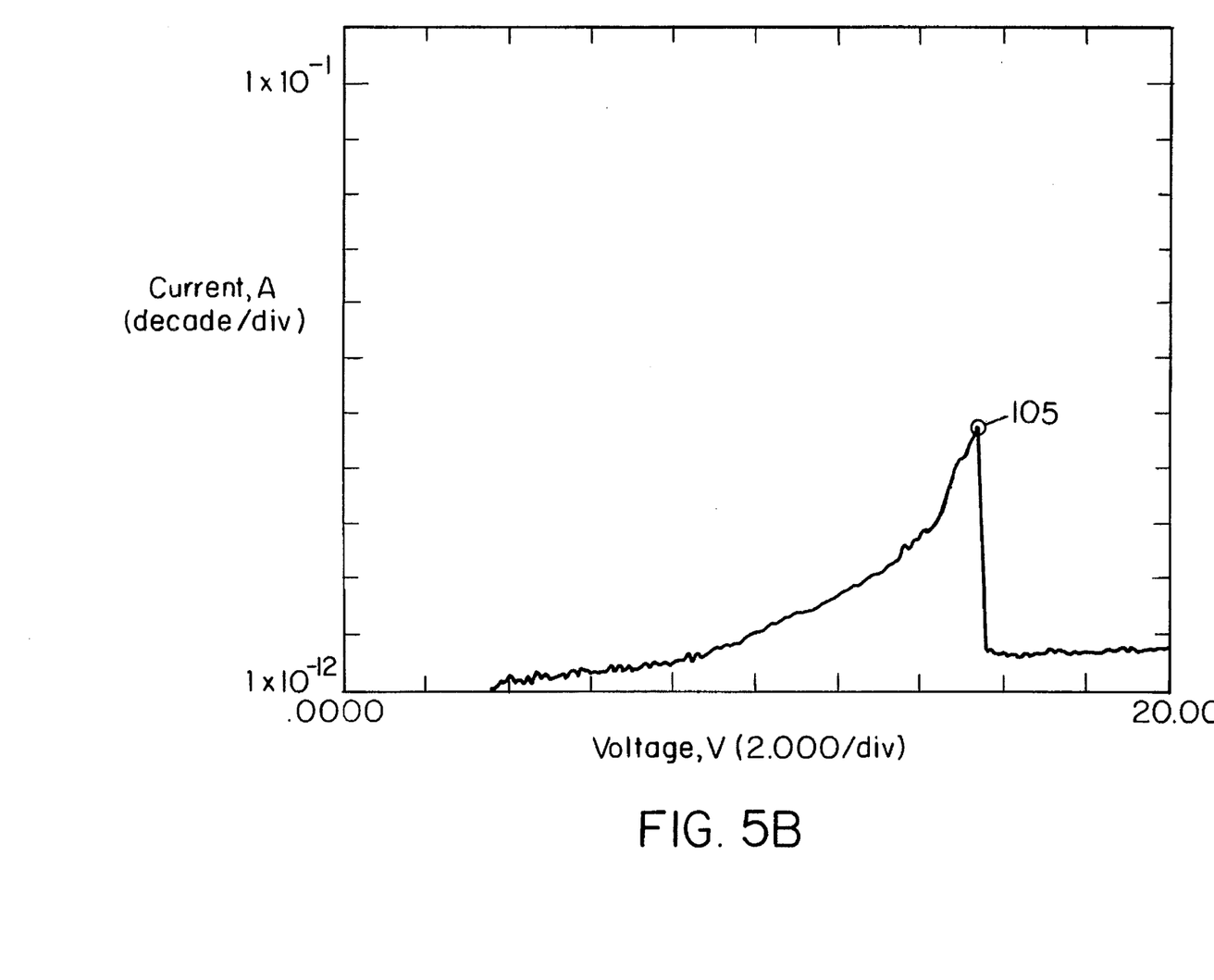
FIG. 5B is a plot of voltage applied across the conductors of the device of the invention versus the resulting current through the device for the conductor fusing process of the invention.

FIGS. 5A and 5B are plots of current through a device of the invention versus the voltage applied across the device. FIG. 5A is a plot for the case in which a link is formed, and FIG. 5 shows the case in which the conductor of the device is fused. The plots were obtained by stepping the voltage applied from 0 to 20 volts in 0.1 volt increments. The duration of time at each voltage step was approximately 0.1 second. The average time required to carry out the fusing or linking process of the invention is on the order of 0.001 second. Therefore, for purposes of the plots of FIGS. 5A and 5B, the entire fusing or linking process is carried out in a single voltage step.

FIG. 5A shows the I-V characteristic for the linking process. As shown in the graph, as the voltage is increased, the insulator begins to break down and current begins to flow. As the marker 101 indicates, at a voltage of approximately 16.2 volts, the insulator completely breaks down, the permanent link is formed and the current increases rapidly. Theoretically, the current would increase into infinity. However, the flat portion of the line at 103 indicates the current limiting of the test equipment used to perform the experiment. This test was performed with a limiting resistance $R_L$ of 5 kilohms. With such a high resistance, the current through the transient link was limited sufficiently to prevent the conductor from being boiled away. Thus, the permanent link was formed.

FIG. 5B shows a similar plot for the fusing process. Once again, the voltage is stepped from 0 to 20 volts in increments of 0.1 volt. In this case, a very low limiting resistance $R_L$ on the order of 50 ohms was used. Thus, as the voltage is increased, the current increases at a higher rate than in the linking process. As the voltage is increased, the current continues to increase as the insulator breaks down, until finally, as indicated by the marker 105, at a voltage of approximately 15.4 volts, the fusing process is completed and the current drops to a very low level. It should be noted that the curve and marker 105 indicate that the current increases to approximately 54.69 nanoamps before the conductor is fused. However, the current actually increases to a higher level. The curve of FIG. 5B does not show this because its resolution in voltage is only 0.1 volts and in time is 0.1 seconds. With such coarse resolution in data points, the actual peak fusing current is not captured.

The fusing process described above calls for applying the programming voltage across the conductor and the control electrode. In general, the voltage can be applied to the conductor at either of the conductor fuse terminals, that is, on either side of the breakpoint. Current will flow through the via to link or fuse the conductor. It has been shown however that applying voltage to only one side of the conductor causes the transient conductive link to be formed on that side of the via. Consequently, the heating and conductor melting are concentrated on that side of the via. To generate a more symmetric cut, the conductor voltage can be applied simultaneously to both sides of the via. With symmetric heating, at a given power level, conductor cuts can more reliably be formed.

Also, the foregoing description refers to a device having only two metallization layers. It will be understood that the invention is applicable to devices having any number of conductive layers. Any two of the layers can be selectively linked, or any one of the layers can be fused in accordance with the invention, as long as appropriate device processing is carried out to locate a conductor adjacent to a control electrode across a link insulator.

Figure 6:
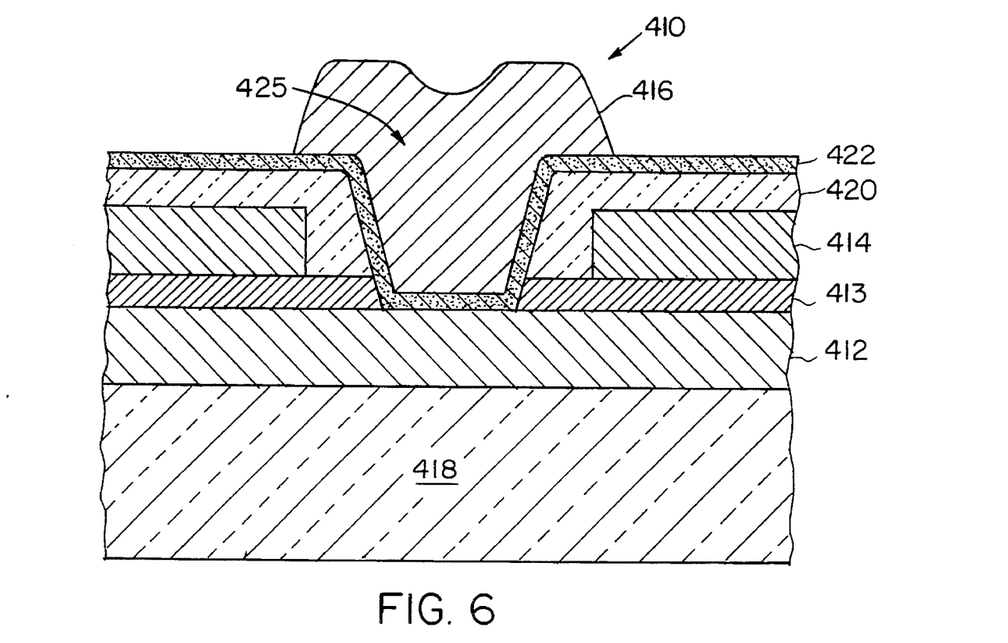
FIG. 6 is a cross-sectional view of the fuse structure of the invention used in a circuit having three conductive layers.

For example, FIG. 6 shows a fuse device 410 in accordance with the invention in a circuit having three metallization layers 412, 414 and 416 formed over a substrate 418. The device 410 has been fabricated to either fuse conductor 416 or link it to metallization layer or control electrode 412. An interlevel dielectric layer 413 separates layer 412 from layer 414. Another interlevel dielectric 420 is formed over layer 414. A via hole 425 is formed through both interlevel dielectric layers 413 and 420 down to the top surface of conductive layer 412. It should be noted that when conductive layer 414 is formed, a hole is left in the area of the fuse 410. Thus, when the via hole 425 is formed, it does not penetrate conductive layer 414. The link insulator 422 is formed over the interlevel dielectric 420 into the via hole 425 and over the top of conducting layer 412. The top conductor 416 is formed over the link insulator 422.

As in the two-conductor device previously described, the conductor 416 can be linked to the conductor or control electrode 412 by applying the programming voltage $V_P$ across the two conductors with the high-value linking limiting resistance $R_L$ in series. To fuse conductor 416, the programming voltage $V_P$ is applied with the low-value fusing resistance $R_L$.

The novel and inventive fusing device and method having been described in detail above, several systems which can be used to program the fuse and/or in which the fuse can be used will now be described in detail.

Figure 7A:
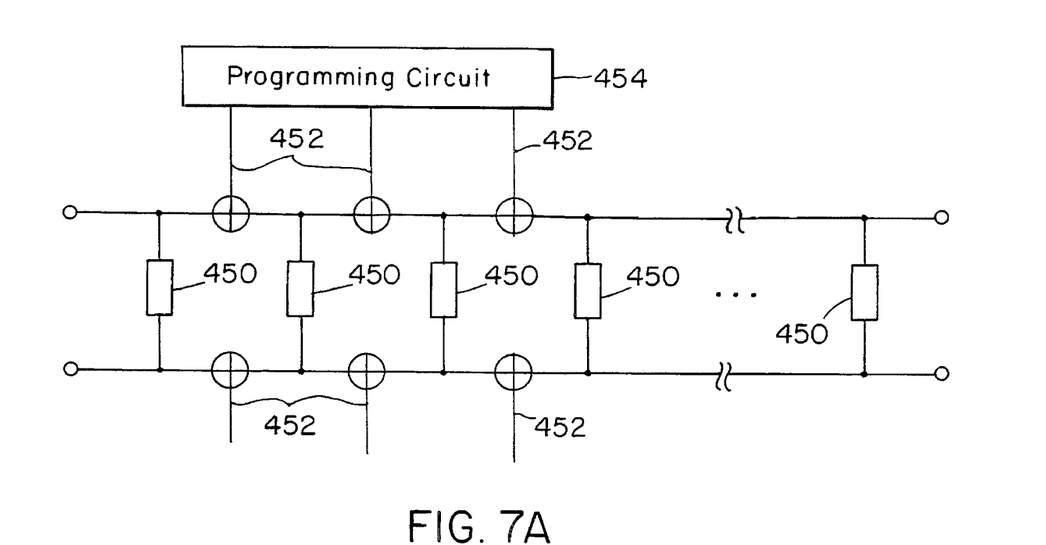
FIG. 7A is a schematic of a network of electrical components which may be connected in series or parallel using fuses Of the present invention.

In one application using the three-terminal fuse described here it is possible to program any series-parallel combination of electrical components 450 such as resistors, capacitors, transistors or delay lines using the configuration shown in FIG. 7A. The control electrodes 452 from a programming circuit 454 are used to cut the horizontal buses at fuse points so that, for instance, if alternate cuts are made on the top and bottom buses, the components that were originally all in parallel would then comprise a series string. In this manner, by selecting the desired cut points, combinations of serial and parallel components can be formed by selection of the appropriate control electrodes.

Furthermore, the electronic components 450 in FIG. 7A can themselves each be a circuit of programmable series-parallel resistors, capacitors, etc. having the same network form of FIG. 7A. In this way a hierarchy of programmable interconnect can be constructed.

Figure 7B:
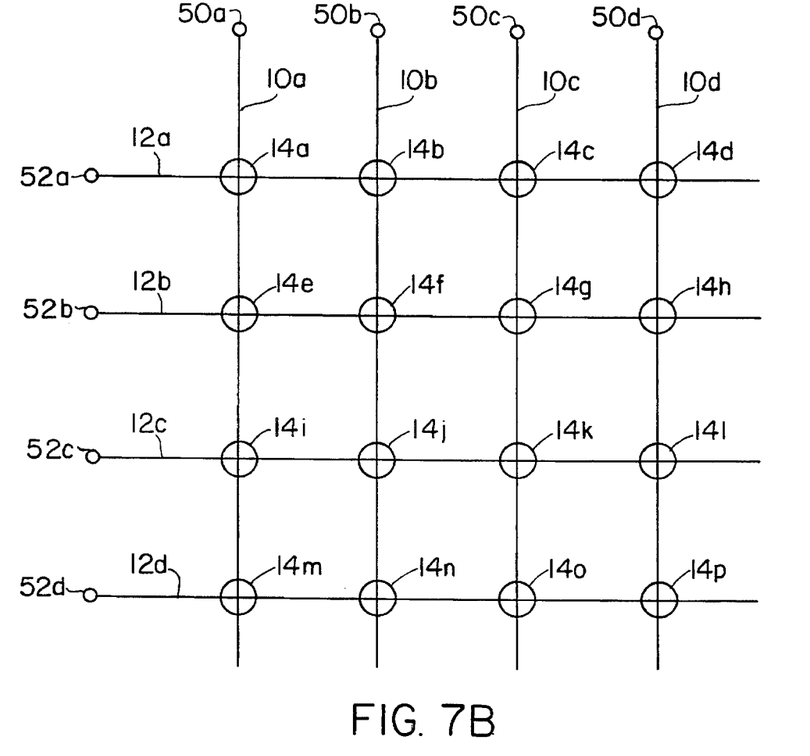
FIG. 7B is a schematic of an interconnection network using the fuse of the present invention.

FIG. 7B schematically illustrates an interconnection network which uses the fuse structure 14 of the invention to selectively link or cut conductors. The figure shows a grid of four control electrodes or lower conductors 12a–12d crossing four upper conductors 10a–10d at a plurality of fuse devices 14a–14p. The control electrodes 12a–12d are connected to terminals 52a–52d, respectively, and the upper conductors 10a–10d are connected to terminals 50a–50d, respectively. To activate one of the fuse structures 14, the programming voltage $V_P$ is applied across the appropriate terminals. For example, to activate fuse device 14g, the programming voltage is applied across terminals 52b and 50c. To link control electrode 12b with conductor 10c, the programming voltage $V_P$ is applied to terminal 52b and 50c through the higher source resistance $R_L$ required for maintaining the lower linking current. To cut conductor 10c instead, the programming voltage $V_P$ is applied at terminal 52b through the lower resistance $R_L$ which allows higher programming current to fuse the upper conductor 10c. It should be noted that the circuit of FIG. 7B does not allow complete flexibility in selectively linking or fusing devices 14. For example, once a conductor 10 is linked to a control electrode 12, the effective short circuit between the two can hinder further programming. Also, once an upper conductor 10 is cut, no fuses below the blown fuse can subsequently be activated since the line has been cut and no current can reach a lower fuse.

One way to discriminate among fuses in a row or column is to set them up to be activated at different programming voltages $V_P$ so that, at a certain $V_P$, only a single fuse is activated. This can be done by fabricating the fuses to have different inherent threshold voltages $V_{th}$, i.e., voltages at which the link insulator breaks down. This can be accomplished by varying the thickness of the link insulator. This approach however, is not preferred since it introduces complexities into the device fabrication process.

Figure 8:
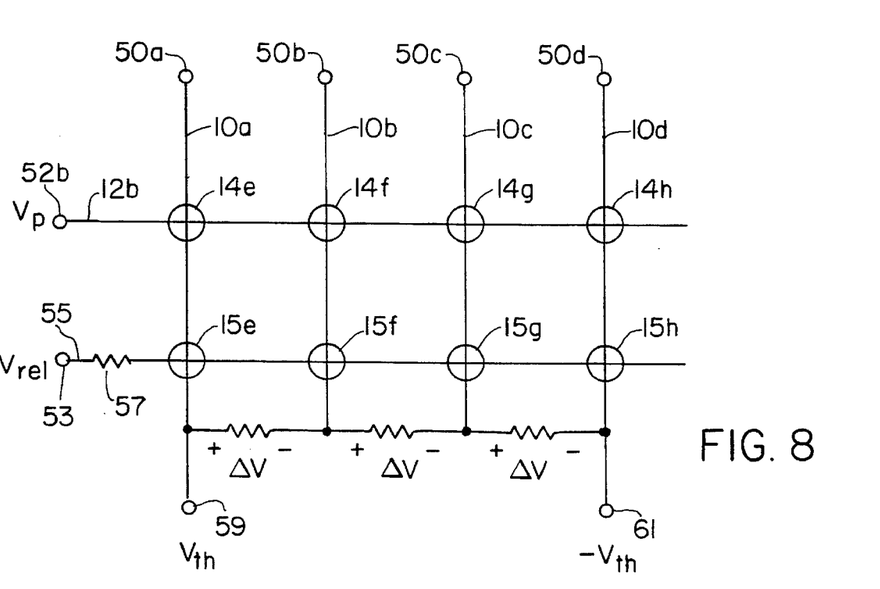
FIG. 8 is a schematic diagram of an interconnection network using fuses of the present invention and a threshold voltage variation network.

FIG. 8 shows an alternative approach in which the thresholds are controlled by applying a variable bias voltage to each of the fuses 14. For illustration purposes, only one row of the network of FIG. 7B is shown in FIG. 8. It will be understood that the technique is applicable to any number of rows. In this configuration, each of the fuses has similar threshold voltage $V_{th}$, and a low impedance resistor string serves to supply a bias voltage to each of the fuses 14. This provides a controllable means for effectively shifting the threshold of the devices 14 while having a single device type at all locations. In this configuration, a bias voltage of 2 $V_{th}$ is applied across the small impedance resistor string with $+V_{th}$ applied at terminal 59 and $-V_{th}$ applied at terminal 61, resulting in a voltage drop of $\Delta V$ at each resistor. Consequently, each conductor 10a–10d is at a different elevated voltage. Each of the fuse devices 14e–14h has the same threshold voltage $V_{th}$, but because of the bias voltage on the conductors 10a–10d, a different programming voltage $V_P$ will be required to program each device.

To program fuse 14h, $V_P$ is set at a first programming voltage and the pulse is applied. Because of the bias on the upper conductor 10c of fuse device 14g, a programming voltage $V_P$ slightly higher than $V_{th}+\Delta V$ is required to program the device. A pulse having a programming voltage $V_P>(V_{th}+2\Delta V)$ is applied to program device 14f, and programming voltage $V_P>(V_{th}+3\Delta V)$ is applied to program device 14e.

One complication to this approach is that after programming a connection between control electrode 12b and an upper conductor 10, the programming electrode 12b is then coupled to the bias voltage. For example, if fuse 14h is programmed to connect conductor 10d to conductor 12b, then $-V_{th}$ will then be coupled to the control electrode 12b. To eliminate this coupling, another cutting fuse device 15h is included. By applying a release voltage $V_{rel}$ to terminal 53, fuse device 15h cuts conductor 10d. Similarly, fuse devices 15e–15g are included to do the same for fuse devices 14e–14g.

Thus, the configuration includes another control conductor 55 to control the cutting process of fuse structures 15e–15h. The release electrode 53 is always connected through a low value resistor and programs a fuse structure 15 on each output line for cutting immediately after making any connection between the control electrode 12b and any upper or output conductor 10a–10d. To guarantee that only the desired output or upper conductor 10a–10d is released from the bias resistor string, $V_{rel}$ is set equal to the value $V_P$ used to program the corresponding link.

The number of discrete bias steps along the resistor string is given by $$\frac{2V_{th}}{\Delta V}.$$

This is achieved when the right most bias terminal is set at $-V_{th}$ and the left most bias terminal is at $+V_{th}$. The range of voltages for $V_P$ then is between approximately 0 and approximately 2 $V_{th}$ as connections are programmed successively starting from the right most edge.

Figure 9:
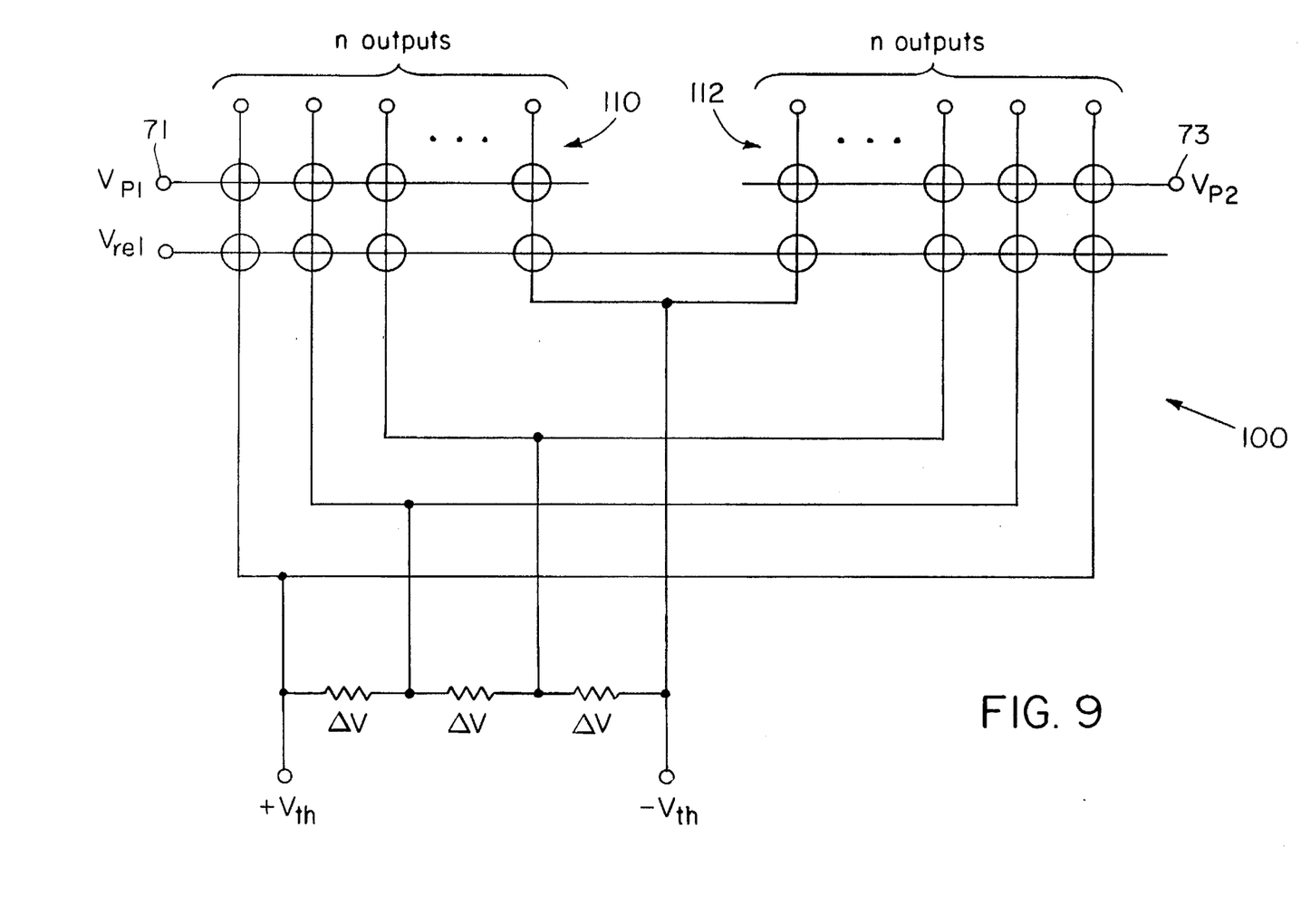
FIG. 9 is a schematic diagram of an expanded version of the interconnection network of FIG. 8.

The structure of FIG. 8 can be extended to double the number of output or upper electrodes 10 at the expense of only one more control terminal 12 by replicating the structure and providing a separate programming electrode $V_{P2}$ as shown in FIG. 9. Each additional programming input $V_P$ provides an additional n output or upper conductors 110, 112 as shown. After programming, this structure is a useful but less than ideal network in that there is the finite resistance of programmed antifuses in the path between the common input electrodes 71 and 73 and the output conductors 110 and 112. This path resistance is typically tens of ohms.

Figure 10:
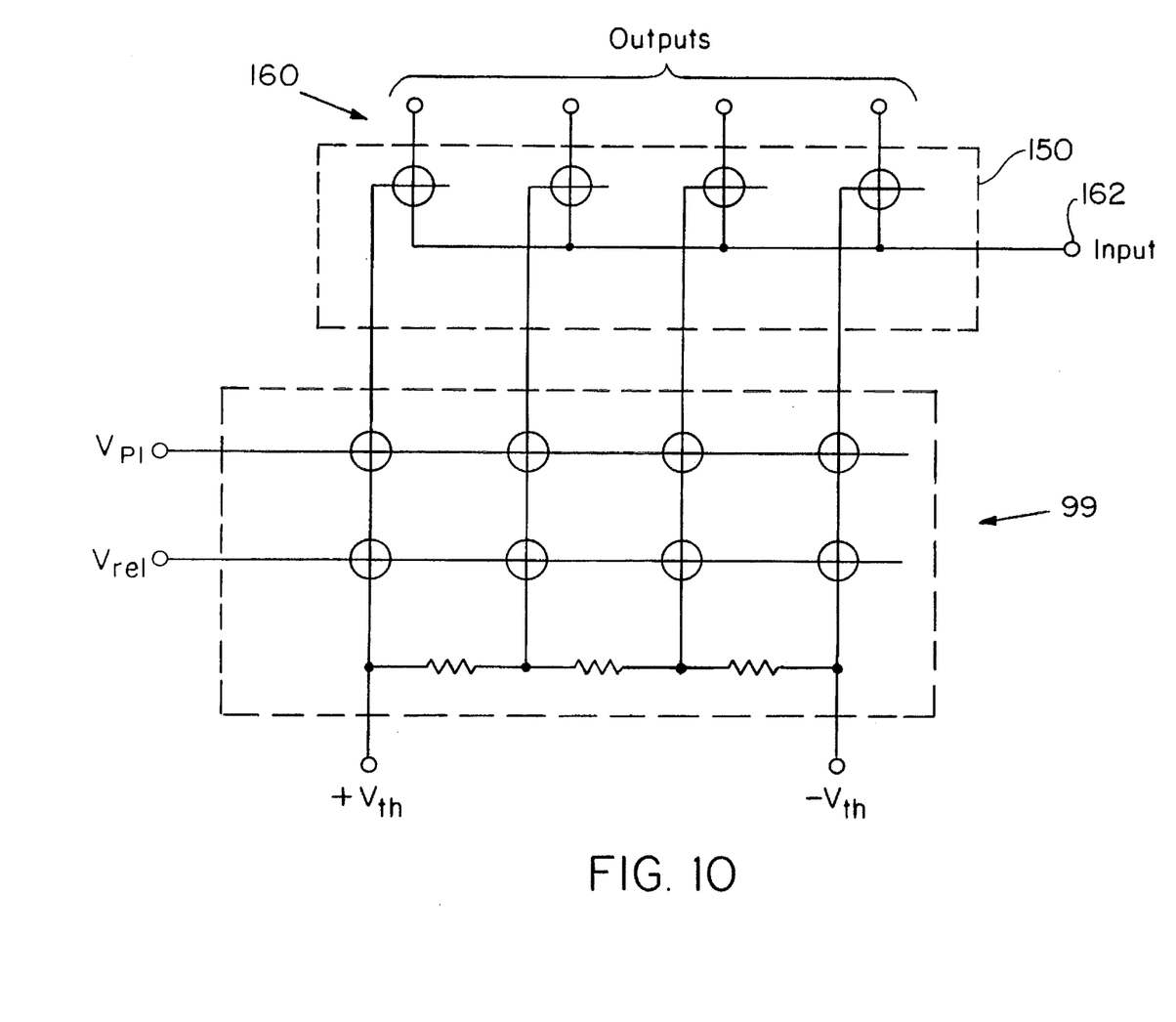
FIG. 10 is a schematic diagram of a programmed network in accordance with FIG. 8 used to program a programmable circuit.

It is possible however to use this programmed network to program still another array of fuse structures to realize an ideal network whose resistance is only that of the conductors. This is accomplished by using the linked network 100 of FIG. 9 to selectively program fuse structures in a second network. FIG. 10 shows a portion 99 of the programmed control network 100 of FIG. 9 used to program an ideal programmable network 150 which comprises fusible paths that can be opened in any arbitrary pattern by applying voltage above the threshold through a low value resistor to the terminal $V_{P1}$. The voltage will be connected through all of the previously connected links in the programmed network 99 to the control electrodes of the fuses in the ideal programmable network 150. Where cuts are not made, the input 162 to the programmable network will be connected through near zero resistance to outputs 160.

Figure 11:
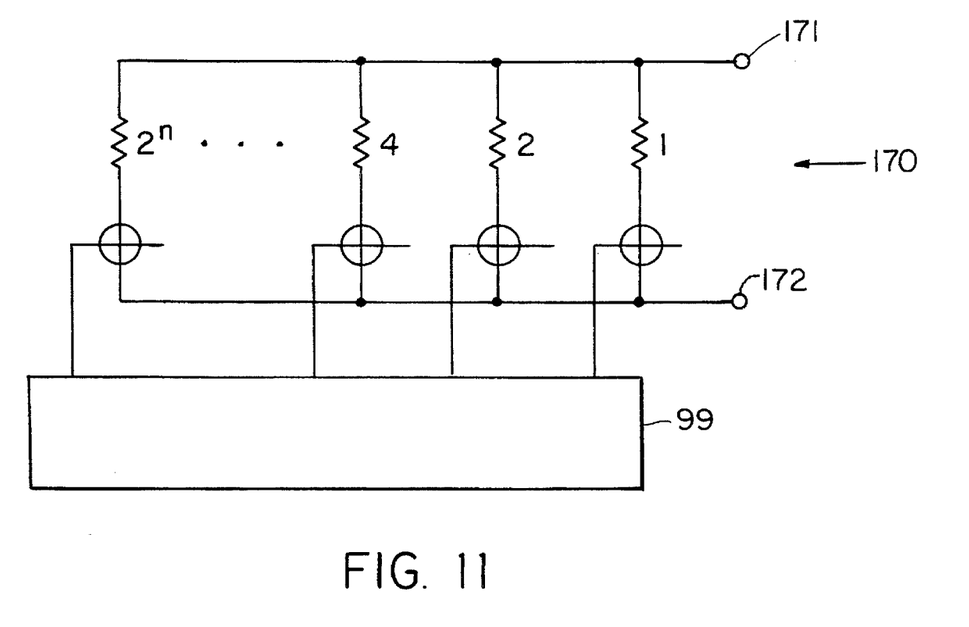
FIG. 11 is a schematic diagram of a programmed network used to program a precision resistor package using fuses of the present invention.

This same architecture can be used in many different applications. For example, as shown in FIG. 11, a programmable resistor 170 can be built whose value can be controlled to very high precision. It is accomplished by having an array of resistors fabricated in parallel on a common substrate with the fuses of the invention in series with each, controlled by a programmable fuse controller 99. If the resistors are successively doubled in value, it is possible to cover a very wide range of resistance values with very high precision. Using the fuses to selectively cut conductors and hence eliminate resistors, the total resistance between terminals 171 and 172 can be precisely set. Alternatively, the dual of this circuit has resistors in series with each shunted by a conductor with a three-terminal fuse in its path. It will achieve the identical result.

This same architecture can also be used to build programmable capacitors or transistors with programmable transconductance. It can also be used to build a programmable delay line by selectively cutting shunts across sections of tapped delay line so that the total delay is equal to the sum of the delays through the unshunted sections.

Figure 12:
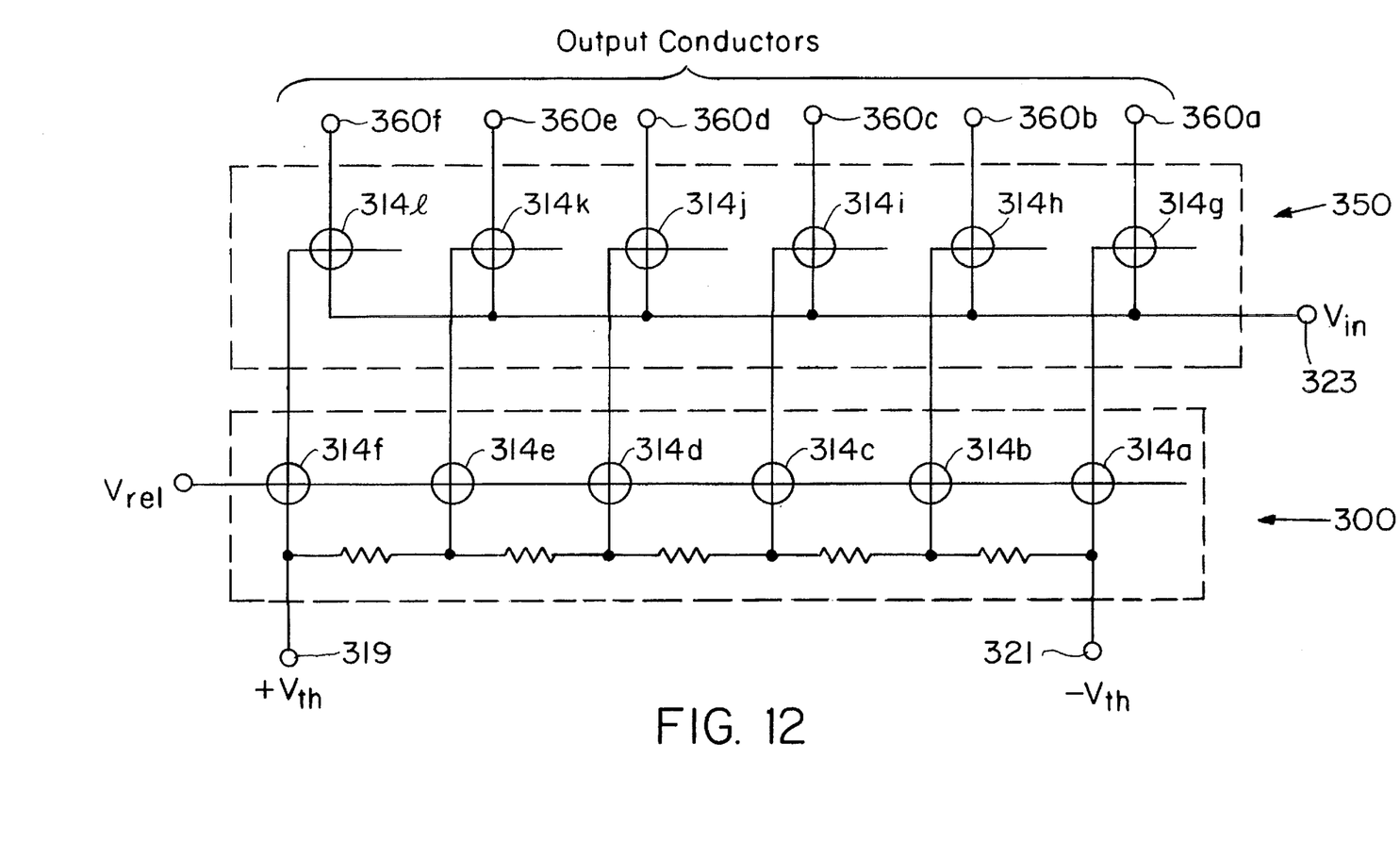
FIG. 12 is a schematic diagram of programming network used to program another programmable network using fuses of the present invention.

FIG. 12 is a schematic diagram of an alternative interconnection network 300 used to program a programmable network 350 such as the precision resistor network 170 shown in FIG. 10. Here the number of output conductors is different than that for the other figures, however, it will be understood that the interconnection networks shown in the figures are applicable to any number of conductors. In this embodiment, the fuse structures 314 are used only for cutting. None of the conductors are linked together.

Once again, bias voltages are applied to each of the fuse structures 314 via the $V_{th}$ terminals 319 and 321. Before programming, each of the output conductors 360a–360f is connected to the input terminal 323. The programmable network 350 is programmed by selectively breaking a connection between the $V_{in}$ terminal 323 and one of the output terminals 360a–360f. The programming begins at the rightmost end of the row of fuses. If output 360a is to remain connected to input 323, the release voltage $V_{rel}$ is set to 0 and the fuse 314a is programmed to cut to release the conductor from the threshold voltage. The process then steps to the next output conductor 360b. If it is desired to disconnect output 360b from input 323, the programming voltage $-V_{th}+\Delta V$ is not applied to $V_{rel}$; rather, it is applied to $V_{in}$ at terminal 323 to break the conductor at fuse 314h. Thus, the process moves from right to left as described cutting either a release fuse 314a–f or an output fuse 314g–l depending upon whether the corresponding output terminal 360a–f should remain connected to the input terminal 323. If the output terminal 360 is to remain connected to the input terminal 323, the release fuse is blown. If, on the other hand, the output is to be disconnected from the input 323, the output fuse is blown.

It should be noted that in FIG. 12, the bias voltage is connected to the upper conductor in the programming network 300, but serves as control electrodes in the programmable network 350. This results in a reverse polarity bias across the insulator between fuses. This is not a problem in the fuse of the present invention, since it is symmetric and behaves identically regardless of the direction of polarity of the applied voltage.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. A method of cutting across a conductive line at a breakpoint comprising:

providing a control electrode adjacent to the breakpoint with an insulator between the conductive line and the control electrode; and applying a voltage across the insulator between the conductive line and the control electrode to create a transient conductive link between the conductive line and the control electrode through the insulator while applying sufficient current through the transient conductive link to heat around the link sufficiently to cut across the conductive line at the breakpoint to interrupt the continuity of the conductive line.

2. The method of claim 1 wherein the insulator comprises amorphous silicon.

3. The method of claim 1 wherein the insulator comprises silicon oxide.

4. The method of claim 1 wherein the insulator comprises a silicon nitride-silicon oxide-silicon nitride composite.

5. The method of claim 1 wherein the applying step comprises applying the voltage across the insulator and a limiting resistor in series with the insulator.

6. A method of cutting across a conductive line between first and second terminals of a three-terminal device comprising:

providing an electrode adjacent to a breakpoint of the conductive line and separated from the conductive line by an insulator, the electrode being connected to a third terminal of the three-terminal device; and applying a voltage across the third terminal and one of the first and second terminals to generate current through the insulator such that a region around the breakpoint is sufficiently heated to cut across the conductive line at the breakpoint to interrupt the continuity between the first and second terminals.

* * * * *

UNITED STATES PATENT AND TRADEMARK OFFICE
CERTIFICATE OF CORRECTION

PATENT NO. : 5,468,680
DATED : November 21, 1995
INVENTOR(S) : Simon S. Cohen

It is certified that error appears in the above-indentified patent and that said Letters Patent is hereby corrected as shown below:

Column 1, line 3,

--Government Support

This invention was made with government support under Contract No. F19628-90-C-0002 by the Air Force. The government has certain rights in the invention.--

Signed and Sealed this

Twentieth Day of August, 1996

Attest:

BRUCE LEHMAN

Attesting Officer     Commissioner of Patents and Trademarks